(12) United States Patent
Aritome

(10) Patent No.: US 9,123,748 B2
(45) Date of Patent: Sep. 1, 2015

(54) METHOD OF MANUFACTURING A SEMICONDUCTOR DEVICE

(71) Applicant: SK hynix Inc., Gyeonggi-do (KR)

(72) Inventor: Seiichi Aritome, Gyeonggi-do (KR)

(73) Assignee: SK Hynix Inc., Gyeonggi-do (KR)

(*) Notice: Subject to any disclaimer, the term of this patent is extended or adjusted under 35 U.S.C. 154(b) by 0 days.

(21) Appl. No.: 14/567,810

(22) Filed: Dec. 11, 2014

(65) Prior Publication Data
US 2015/0099354 A1    Apr. 9, 2015

Related U.S. Application Data

(62) Division of application No. 13/605,972, filed on Sep. 6, 2012, now Pat. No. 8,937,346.

(30) Foreign Application Priority Data
May 2, 2012 (KR) .......... 10-2012-0046368

(51) Int. Cl.
H01L 27/00 (2006.01)
H01L 29/66 (2006.01)
H01L 27/115 (2006.01)
H01L 29/788 (2006.01)
H01L 21/28 (2006.01)
G11C 16/04 (2006.01)

(52) U.S. Cl.
CPC .... *H01L 29/66825* (2013.01); *H01L 21/28273* (2013.01); *H01L 27/11556* (2013.01); *H01L 29/66666* (2013.01); *H01L 29/788* (2013.01); *H01L 29/7889* (2013.01); *G11C 16/0416* (2013.01)

(58) Field of Classification Search
CPC .......... H01L 21/28273; H01L 27/11556; H01L 29/7889; H01L 29/788; H01L 29/66666; H01L 29/66825; G11C 16/0416
See application file for complete search history.

(56) References Cited

U.S. PATENT DOCUMENTS

| | | | |
|---|---|---|---|
| 2006/0033147 A1* | 2/2006 | Tang | 257/315 |
| 2009/0121271 A1* | 5/2009 | Son et al. | 257/315 |
| 2010/0322000 A1* | 12/2010 | Shim et al. | 365/185.03 |
| 2011/0032772 A1* | 2/2011 | Aritome | 365/185.29 |
| 2011/0291177 A1* | 12/2011 | Lee et al. | 257/324 |
| 2012/0092926 A1* | 4/2012 | Whang et al. | 365/185.01 |
| 2013/0043521 A1* | 2/2013 | Jung | 257/315 |
| 2013/0049095 A1* | 2/2013 | Whang et al. | 257/321 |

* cited by examiner

Primary Examiner — Nikolay Yushin
(74) Attorney, Agent, or Firm — IP & T Group LLP

(57) ABSTRACT

A semiconductor device includes vertical channel layers, control gates and interlayer insulating layers stacked alternately with each other on the substrate and surrounding the vertical channel layers, floating gates interposed between the vertical channel layers and the control gates and separated from each other by the interlayer insulating layers, and charge blocking layers interposed between the floating gates and the control gates.

11 Claims, 12 Drawing Sheets

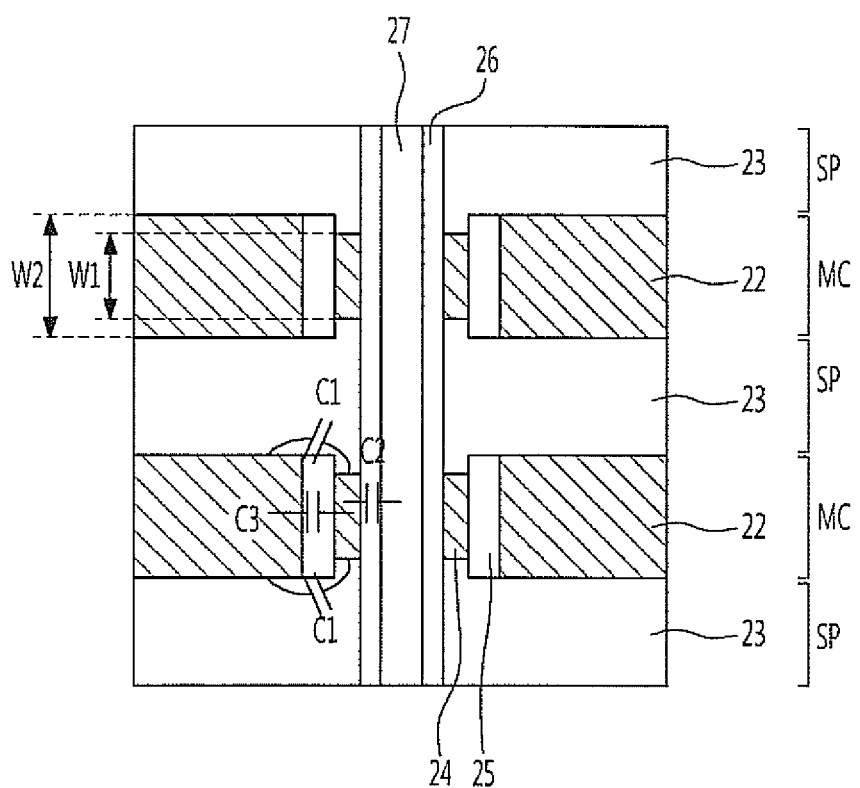

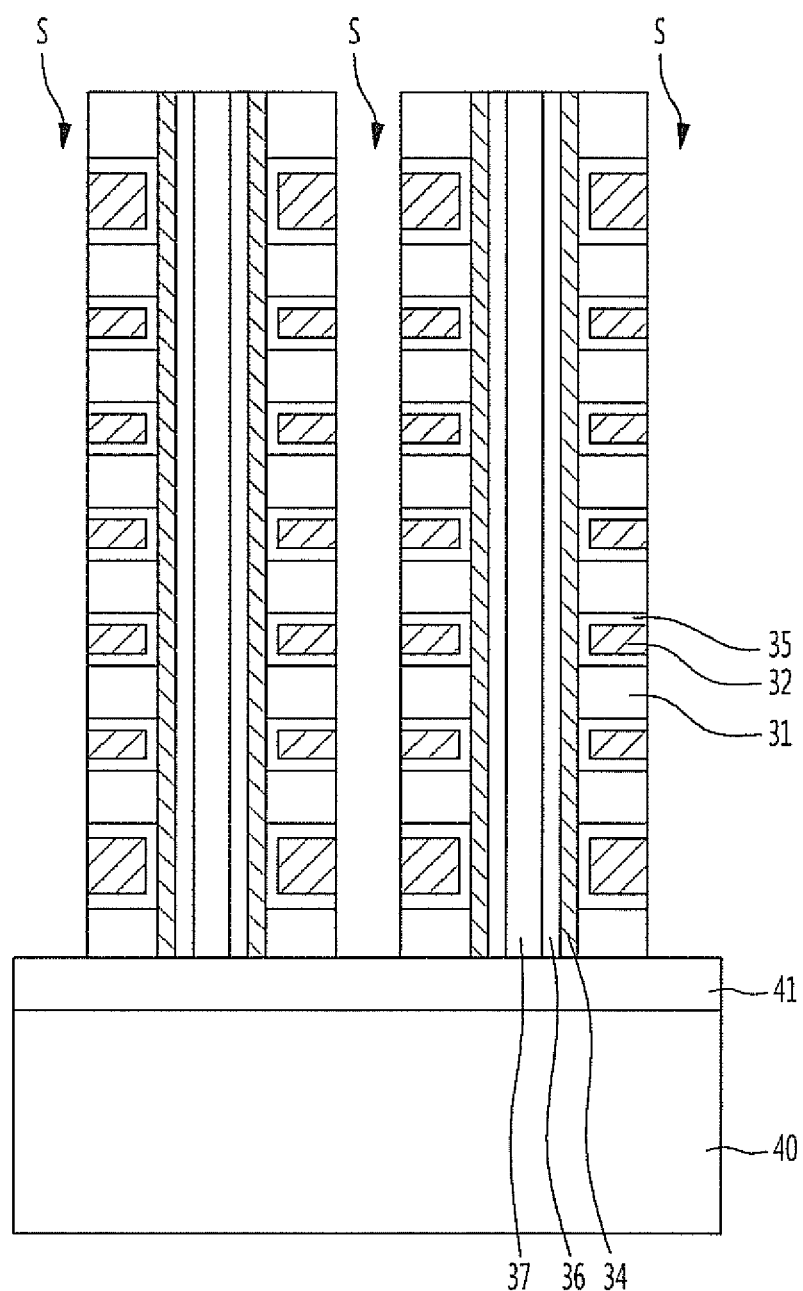

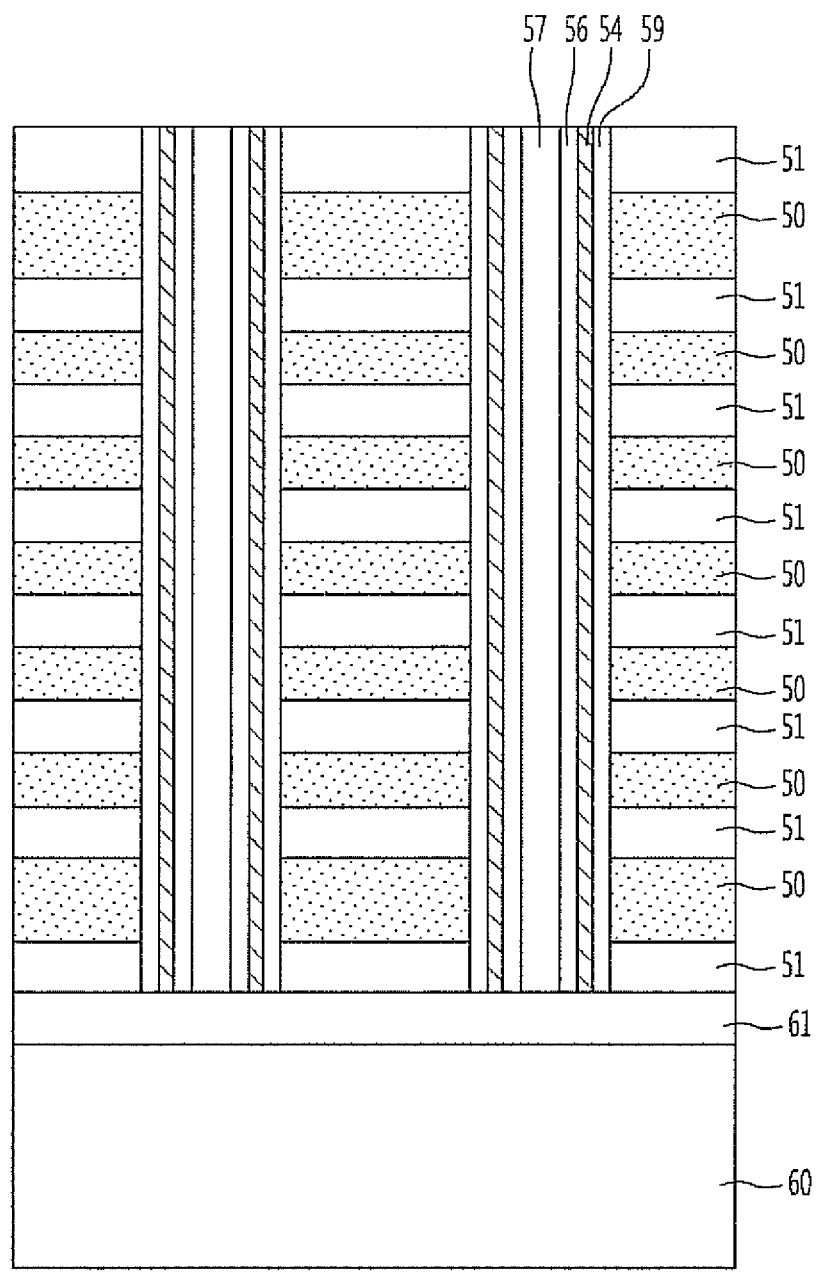

METHOD OF MANUFACTURING A SEMICONDUCTOR DEVICE

CROSS-REFERENCE TO RELATED APPLICATION

This application is a division of U.S. patent application Ser. No. 13/605,972 filed on Sep. 6, 2012, which claims Priority to Korean patent application number 10-2012-0046368 filed on May 2, 2012. The entire disclosure of which is incorporated by reference herein, is claimed.

BACKGROUND

1. Field of Invention

Exemplary embodiments of the present invention relate to a semiconductor device and a method of manufacturing the same and, more particularly, to a three-dimensional non-volatile memory device having floating gates and a method of manufacturing the same.

2. Description of Related Art

A non-volatile memory device retains data stored therein even in the absence of power supply. Two-dimensional memory devices being manufactured as a single layer on a silicon substrate are reaching physical limits in increasing the degree of integration. Accordingly, three-dimensional non-volatile memory devices that have a plurality of memory cells stacked in a vertical direction on a silicon substrate have been proposed.

FIG. 1 is a cross-sectional view illustrating a cell structure of a conventional three-dimensional non-volatile memory device.

As shown in FIG. 1, a memory device includes a lower select transistor LST, a plurality of memory cells MC, and an upper select transistor UST that are stacked along channel layers 17 that protrude from a substrate 10 having a source region 11 formed thereon.

Each of the memory cells MC includes the channel layer 17, a floating gate 14 having an annular shape to cover the channel layer 17, a tunnel insulating layer 16 interposed between the channel layer 17 and the floating gate 14, control gates 12 stacked alternately with the floating gate 14, and a charge blocking layer 15 interposed between the floating gate 14 and the control gates 12.

According to the cell structure of the conventional memory device, each of the memory cells MC includes one floating gate 14 and two control gates 12. Therefore, each memory cell MC is controlled by two control gates 12, and adjacent memory cells MC in a stacking direction share the control gates 12.

A process of manufacturing the conventional memory device will now be described in brief.

First, conductive layers 12 and interlayer insulating layers 13 are alternately stacked on the substrate 10 having the source region 11 formed thereon. Subsequently, the conductive layers 12 and the interlayer insulating layers 13 are etched to form channel holes, and the interlayer insulating layers 13 exposed through the channel holes are partially etched by a given depth to form recessed regions. Next, the charge blocking layers 15 are formed on inner walls of the channel holes having the recessed regions therein, and the floating gates 14 are formed in the recessed regions. The tunnel insulating layers 16 are formed in the channel holes, and channel layers 17 are formed thereon. Finally, the conductive layers 12 and the interlayer insulating layers 13 are etched to form slits between the channel layers 17, and an insulating layer 18 is formed in each of the slits.

According to the above-described process, the thickness of the floating gates 14, i.e., the width of floating gates 14 in FIG. 1, is determined depending on how deep the interlayer insulating layers 13 are etched. However, since it is difficult to etch the interlayer insulating layers 13 evenly, the thickness of the floating gate 14 differs for each memory cell MC. In addition, since the charge blocking layer 15 and the floating gate 14 are formed in the recessed region, the thickness of the interlayer insulating layer 13 is to be increased in order to form the floating gate 14 with a sufficient thickness. However, this results in an increase in thickness of the stacked layers, and the difficulty in the etching process performed to form channel holes is also increased.

BRIEF SUMMARY

Exemplary embodiments relate to a semiconductor device having an improved coupling ratio and a method of manufacturing the same.

A semiconductor device according to an embodiment of the present invention includes vertical channel layers, control gates and interlayer insulating layers stacked alternately with each other on the substrate and surrounding the vertical channel layers, floating gates interposed between the vertical channel layers and the control gates and separated from each other by the interlayer insulating layers, and charge blocking layers interposed between the floating gates and the control gates.

A method of manufacturing a semiconductor device according to another embodiment of the present invention includes forming first sacrificial layers and second sacrificial layers alternately with each other, forming channel holes by etching the first sacrificial layers and the second sacrificial layers, forming a floating gate material layer, a tunnel insulating layer, and a channel layer in the channel holes, forming slits by etching the first sacrificial layers and the second sacrificial layers, forming first recessed regions by removing the first sacrificial layers exposed by the slits, forming first charge blocking layers in the first recessed regions, forming conductive layers in the first recessed regions having the first charge blocking layers formed therein, forming second recessed regions by removing the second sacrificial layers exposed by the slits, forming floating gates by etching the floating gate material layer exposed through the second recessed regions, and forming interlayer insulating layers in the second recessed regions from which the floating gate material layer is etched.

A method of manufacturing a semiconductor device according to yet another embodiment of the present invention includes forming conductive layers and sacrificial layers alternately with each other, forming channel holes by etching the conductive layers and the sacrificial layers, forming a charge blocking layer, a floating gate material layer, a tunnel insulating layer, and a channel layer in the channel holes, forming slits by etching the conductive layers and the sacrificial layers, forming recessed regions by removing the sacrificial layers exposed by the slits, etching the charge blocking layer exposed through the recessed regions and the floating gate material layer exposed through the etched charge blocking layer, and forming interlayer insulating layers in the recessed regions from which the charge blocking layer and the floating gate material layer are etched.

BRIEF DESCRIPTION OF THE DRAWINGS

FIG. 2 is a cross-sectional view illustrating a cell structure of a semiconductor device according to an embodiment of the present invention;

FIGS. 3A to 3C are cross-sectional views illustrating the process flow of a method of manufacturing a semiconductor device according to a first embodiment of the present invention;

FIGS. 4A to 4C are cross-sectional views illustrating the process flow of a method of manufacturing a semiconductor device according to a second embodiment of the present invention;

DESCRIPTION OF EMBODIMENTS

Figure 1:
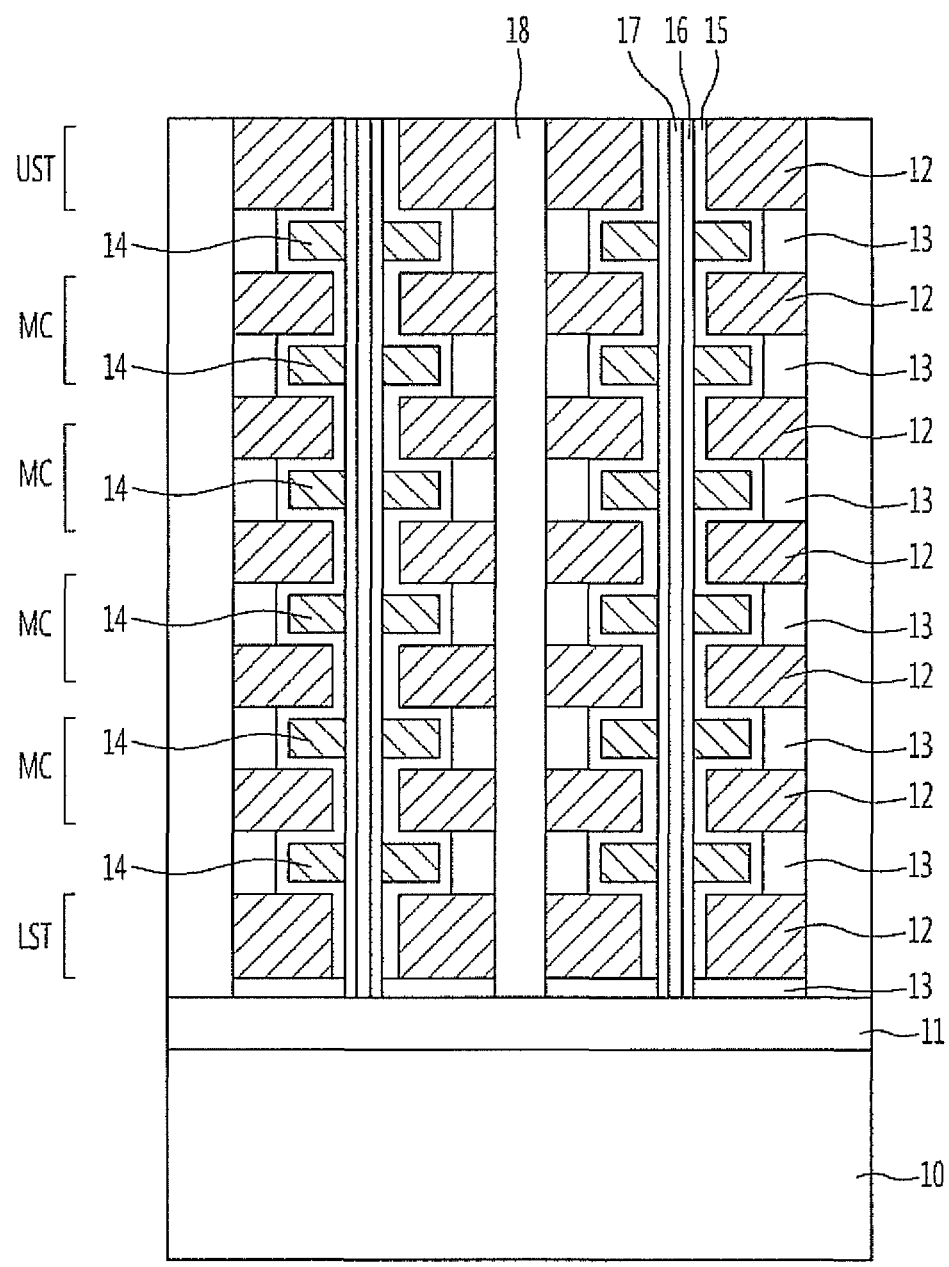
FIG. 1 is a cross-sectional view illustrating a cell structure of a conventional third-dimensional non-volatile memory device.

Hereinafter, various embodiments of the present disclosure will be described in detail with reference to the accompanying drawings. The figures are provided to enable those of ordinary skill in the art to make and use the present invention according to the exemplary embodiments of the present invention.

FIG. 2 is a cross-sectional view of a cell structure of a semiconductor device according to an embodiment of the present invention.

As shown in FIG. 2, a semiconductor device according to an embodiment of the present invention includes vertical channel layers 27 protruding from a substrate (not shown), control gates 22 and interlayer insulating layers 23 stacked alternately with each other and covering the vertical channel layers 27, floating gates 24 interposed between the vertical channel layers 27 and the control gates 22, and charge blocking layers 25 interposed between the floating gates 24 and the control gates 22. In addition, the semiconductor device further includes a tunnel insulating layer 26 that covers a side wall of each of the vertical channel layers 27 continuously. According to the cell structure of the semiconductor device according to this embodiment, a plurality of memory cells MC are stacked along the vertical channel layer 27 with given intervals therebetween.

The vertical channel layers 27 may be arranged in a matrix format or a staggered pattern. In addition, each of the vertical channel layers 27 may be formed of a semiconductor layer or a tubular shape of a semiconductor layer with an insulating layer formed at a central region thereof.

The charge blocking layers 25 may be first charge blocking layers surrounding the floating gates 24, respectively. Alternatively, the charge blocking layers 25 may be U-shaped second charge blocking layers interposed between the floating gates 24 and the control gates 22 and between the control gates 22 and the interlayer insulating layers 23 so that the charge blocking layers 25 cover the top, bottom, and side faces of the control gates 22. The semiconductor device may include either one or both of the first and second charge blocking layers. FIG. 2 shows that the semiconductor device has the first charge blocking layers alone.

The floating gates 24 have an annular shape to cover the vertical channel layers 27. Each of the floating gates 24 may include a polysilicon layer, a metal layer, or a silicide layer. For example, a silicide layer may be a ruthenium silicide (RuSiX) layer.

The floating gates 24 are spaced apart with a given distance and separated from each other by the interlayer insulating layers 23. According to the embodiment of the present invention, the floating gates 24 of the memory cells MC are separated from each other by etching floating gate material layers formed at space areas SP between the memory cells MC. During the etching process, the floating gate material layers of memory cell areas MC may be partially etched. Therefore, a width W1 of each of the floating gates 24 may be smaller than or equal to a width W2 of the control gate 22 or the charge blocking layer 25 (W1≤W2).

A method of driving the semiconductor device having the above-described cell structure will now be described in brief.

During an erase operation, a positive erase voltage Vers is applied to the vertical channel layers 27, whereas the control gates 22 are grounded. Alternatively, the vertical channel layers 27 are grounded, while a negative erase voltage Vers is applied to the control gates 22. At this time, charges (electron) stored in the floating gate 24 of each of the memory cells MC are ejected/discharged to the vertical channel layer 27.

During a program operation, a program voltage Vpgm is applied to control gates 22 of selected memory cells. At this time, charges (electron) are injected to the floating gates 24 of the selected memory cells from the vertical channel layer 27.

During a read operation, a read voltage Vread is applied to the control gates 22 of the selected memory cells, whereas a turn-on voltage Von is applied to the control gates 22 of unselected memory cells. The turn-on voltage Von turns on the memory cells regardless of whether the memory cells are programmed or erased. In addition, the read voltage Vread turns off the memory cells when the memory cells are programmed and turns on the memory cells when the memory cells are erased.

According to an embodiment of the present invention, the floating gates 24 and the charge blocking layers 25 of the vertically stacked memory cells are separated by the interlayer insulating layers 23. Therefore, damage to data caused by movement of charges stored in the floating gates 24 of the stacked memory cells may be reduced.

The floating gates 24 are formed as straight line type to have a uniform thickness that may increase cell current and reduce the difficulty in the process of manufacturing a semiconductor device.

In addition, driving characteristics of a memory device may be improved by increasing a coupling ratio CR of each memory cell. The coupling ratio CR is determined by Equation 1 below. Here, $C_1$ is capacitance at the edge of the charge blocking layer 25, $C_3$ is capacitance at the center of charge blocking layer 25, and $C_2$ is capacitance by the tunnel insulating layer 26.

$$CR = \frac{C_{Charge\ blocking\ Layer}}{C_{Charge\ blocking\ layer} + C_{Tunnel\ insulating\ layer}} = \frac{(C_2 + 2C_1)}{(C_3 + 2C_1) + C_2} \quad \text{[Equation 1]}$$

According to an embodiment of the present invention, capacitance $C_1$ at the edge of the charge blocking layer 25 may be increased by separating the floating gates 24 of the stacked memory cells from each other. The coupling ratio of the memory device is correspondingly increased to improve program/erase speed.

Figure 3A:
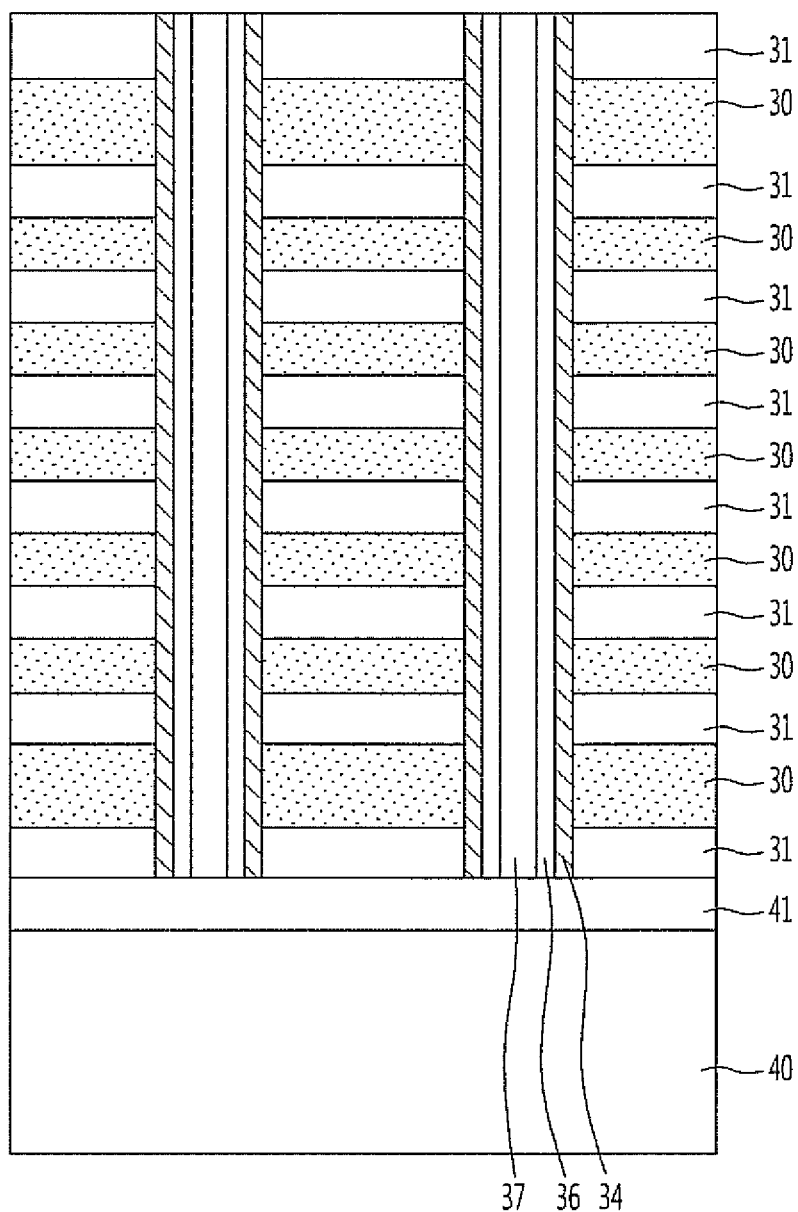
Figure 3C:
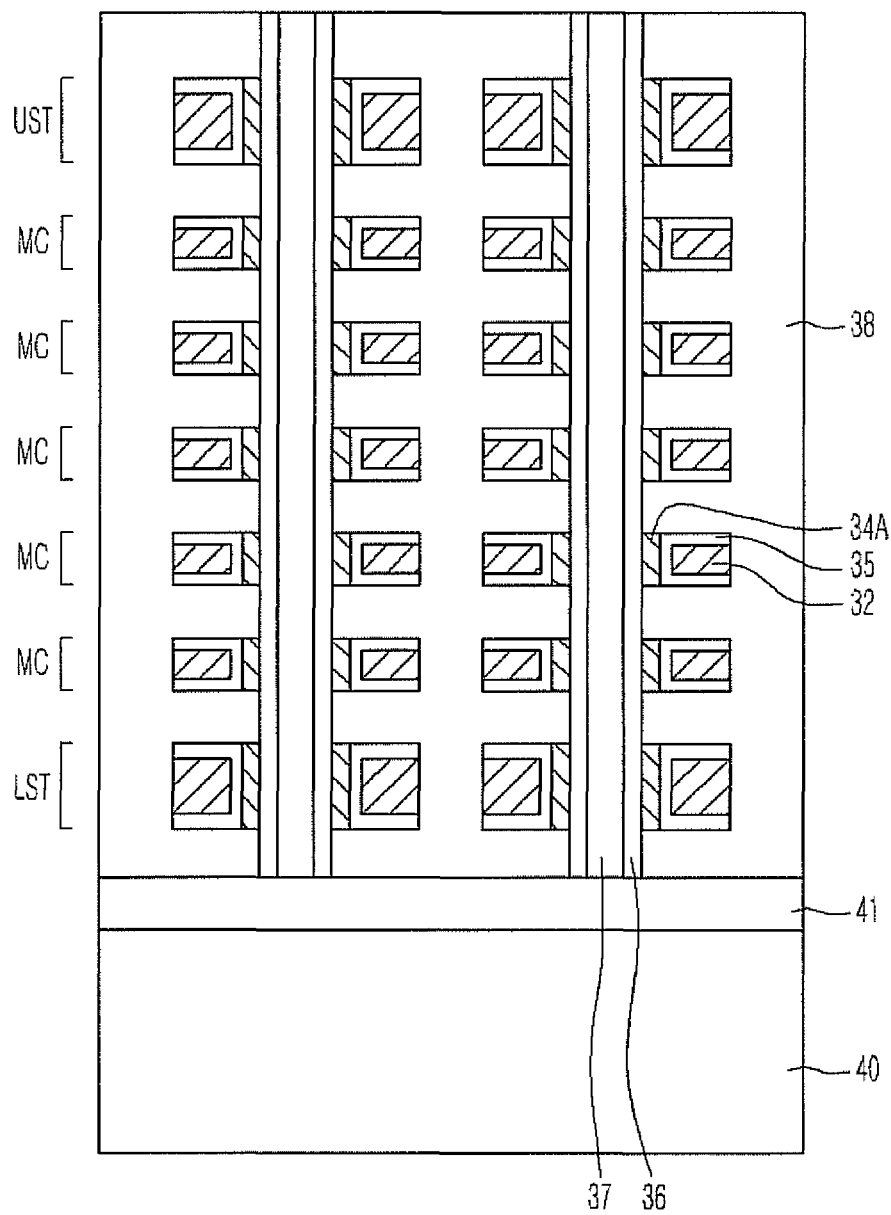

FIGS. 3A to 3C are cross-sectional views illustrating the process flow of a method of manufacturing a semiconductor device according to a first embodiment of the present invention.

As shown in FIG. 3A, first sacrificial layers 30 and second sacrificial layers 31 are alternately formed on a substrate 40 having a given lower structure such as a source region 41. The source region 41 may be formed by doping the surface of the substrate 40 with N type impurities.

The first sacrificial layers 30 are stacked to form control gates or select gates. At least the lowermost first sacrificial layer 30 and the uppermost first sacrificial layer 30, among the first sacrificial layers 30, are provided to form select gates, whereas the other first sacrificial layers 30 are provided to form control gates. The first sacrificial layers 30 for forming select gates may have a larger thickness than the first sacrificial layers 30 for forming control gates in consideration of characteristics of the select transistors. The second sacrificial layers 31 are provided to separate the control gates from the select gates that are stacked one upon another.

The first sacrificial layer 30 and the second sacrificial layer 31 are formed of material layers having a high etch selectivity. In the first embodiment, the first sacrificial layer 30 is formed of an oxide layer SiO2, and the second sacrificial layer 31 is formed of a nitride layer SiN.

Subsequently, the first sacrificial layers 30 and the second sacrificial layers 31 are etched to form channel holes. The channel holes may be arranged in a matrix format or a staggered pattern.

A floating gate material layer 34 is formed in the channel holes. The floating gate material layer 34 is formed with a uniform thickness along inner surfaces of the channel holes, so that the memory cells have floating gates having a uniform thickness. The floating gate material layer 34 may include at least any one of a polysilicon layer, a metal layer, and a silicide layer. In addition, the floating gate material layer 34 may have a thickness of 10 nm or less.

Subsequently, a tunnel insulating layer 36 is formed, and a first channel layer is formed on the tunnel insulating layers 36. The floating gate conductive layer 34, the tunnel insulating layer 36, and the first channel layer are formed on bottom surfaces of the channel holes as well as the side walls thereof. Therefore, in order to expose the source region 41, the floating gate conductive layer 34, the tunnel insulating layers 36, and the first channel layer formed on the bottom surfaces of the channel holes are etched. The first channel layer may serve as a protection layer that reduces damage to the tunnel insulating layer 36 during the etching process.

A second channel layer is formed on the first channel layer. In this manner, vertical channel layers 37 that include the first channel layer and the second channel layer and protrude from the substrate 40 are formed. Here, the first channel layer may be removed before the second channel layer is formed. In addition, each of the channel holes may be filled with the second channel layer or have an open central area. Here, an insulating layer is formed in the open central area of the second channel layer.

As shown in FIG. 3B, the first sacrificial layers 30 and the second sacrificial layers 31 are etched to form slits S between the channel holes. At this time, the slits S may be formed between the entirety of channel holes or the slits S may be formed between a portion of the channel holes.

Subsequently, the first sacrificial layers 30 exposed within the slits S are removed to form first recessed regions. Charge blocking layers 35 are formed in the first recessed regions. Each of the charge blocking layers 35 may be formed of a high dielectric constant (high-k) material layer, such as a hafnium oxide layer HfO, or an ONO layer having an oxide layer, a nitride layer, and an oxide layer stacked one upon another.

Conductive layers 32 are formed in the first recessed regions having the charge blocking layers 35 formed therein. The conductive layers 32 may be formed of a polysilicon layer or a metal layer such as a tungsten layer. For example, after the conductive layers 32 are deposited to fill the first recessed regions, the conductive layers 32 deposited onto the inner walls of the slits S are removed by etch-back, thereby separating the conductive layers 32 formed in the first recessed regions. In this manner, at least one lower select transistor, a plurality of memory cells, and at least one upper select transistor are formed along the vertical channel layer 37.

As shown in FIG. 3C, second recessed regions are formed by removing the second sacrificial layers 31 exposed within the slits S. Subsequently, the floating gate material layer 34 exposed though the second recessed regions is etched. Here, the floating gate material layers 34 formed in the space areas SP are removed while floating gate material layers 34 are left in memory cell areas MC. Floating gates 34A are thereby formed.

When the floating gate material layers 34 are etched, the floating gate material layers 34 on the memory cell regions may also be partially etched. Therefore, the floating gate material layers 34 as thin as 10 nm or less are formed to thereby minimize the amount of the floating gate material layers 34 of the memory cell regions that are etched during the etching process.

Insulating layers 38 are formed in the slits S and the second recessed regions from which the floating gate material layers 34 are etched. At this time, the insulating layers 38 formed in the second recessed regions become interlayer insulating layers that separate the stacked conductive layers 32, that is, the control gates and the select gates stacked one upon another. For reference, air gap may be formed in at least a portion of the second recessed regions and the slits S by controlling deposition conditions of the insulating layer 38.

According to the first embodiment as described above, a three dimensional non-volatile memory device having floating gates may be easily manufactured. In particular, floating gates of memory cells stacked one upon another are formed by a single deposition process, thereby facilitating the formation of floating gates having a uniform thickness. Therefore, the difficulty in the process of manufacturing a three-dimensional non-volatile memory device may be reduced.

In the first embodiment, after the first sacrificial layers are removed, the second sacrificial layers are removed. Alternatively, the first sacrificial layers may be removed after the second sacrificial layers are removed.

In addition, in the first embodiment, at least one lower select transistor, a plurality of memory cells, and at least one upper select transistor that are stacked along the vertical channel layer 37 are formed at the same time. However, they may be formed by separate processes.

In the first embodiment, at least one lower select transistor, a plurality of memory cells, and at least one upper select transistor have the same configuration. Also, the tunnel insulating layers 36, the floating gates 34A, and the charge blocking layers 35 included in the lower select transistor and the upper select transistor function as a gate insulating layer.

However, when at least one lower select transistor, a plurality of memory cells, and at least one upper select transistor are formed using separate processes, the lower and upper select transistors may have a different configuration from the memory cells. For example, after the lower select transistor is formed, the plurality of memory cells are formed, and subsequently, the upper select transistor is formed. When the lower select transistor and the upper select transistor are formed, a gate insulating layer such as an oxide layer is formed within the channel holes.

Figure 4B:
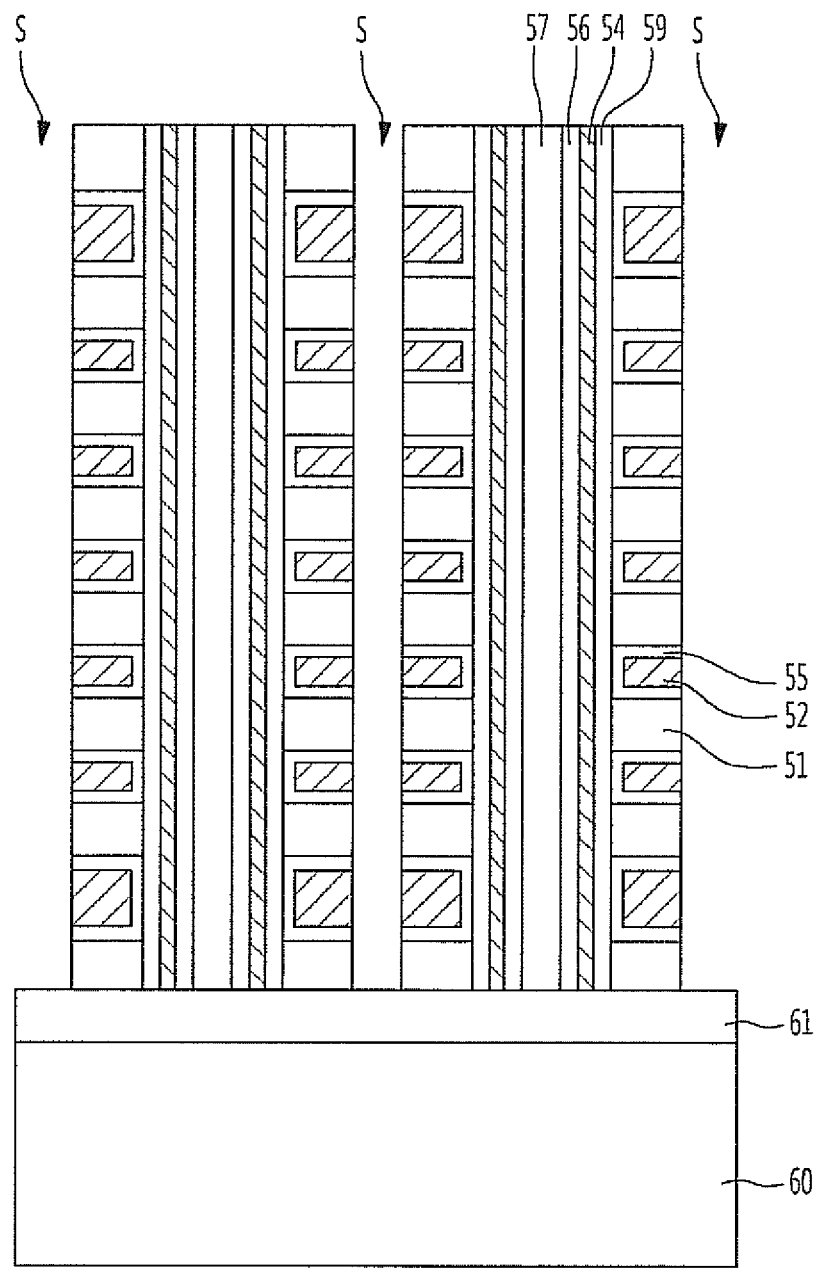
Figure 4C:
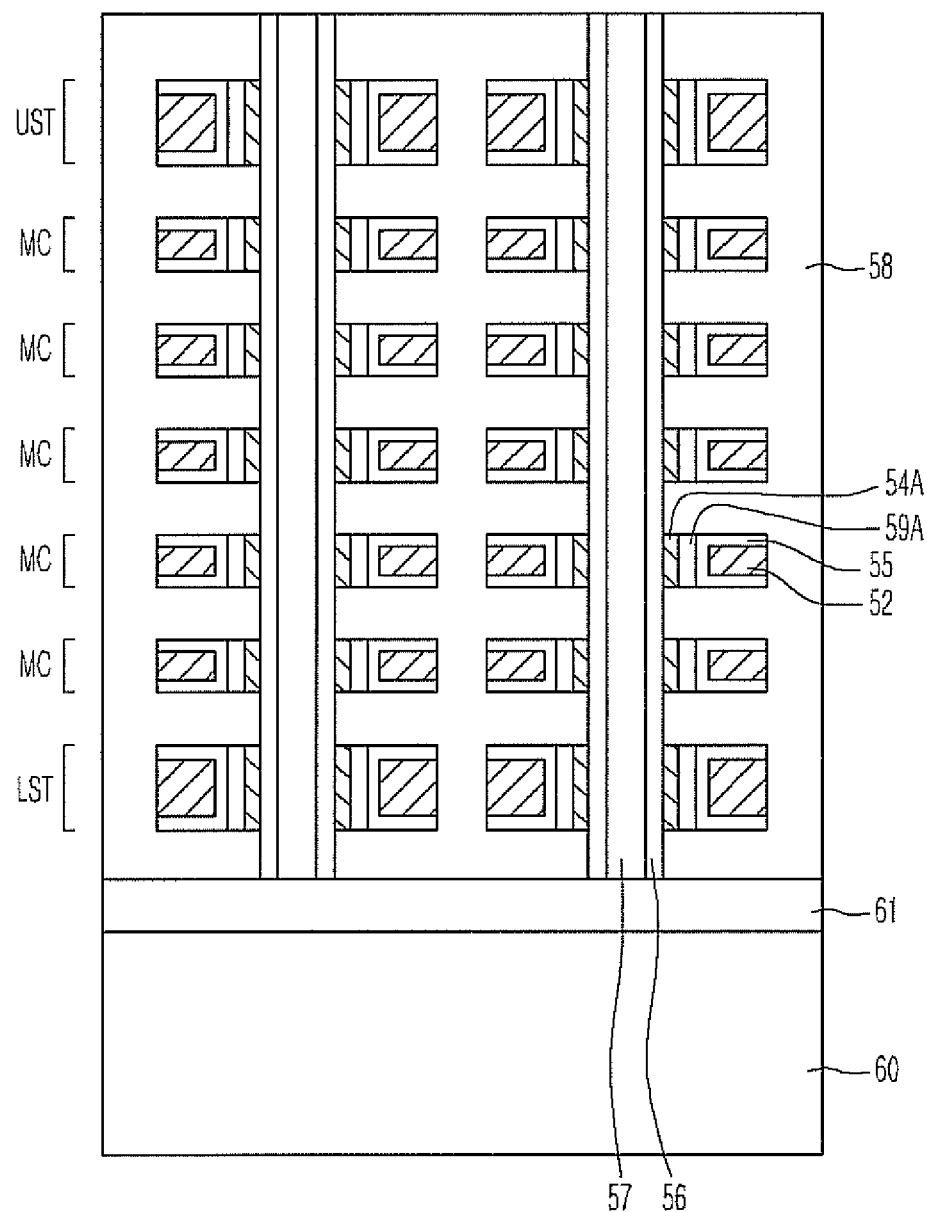

FIGS. 4A to 4C are cross-sectional views illustrating the process flow of a method of manufacturing a semiconductor device according to a second embodiment of the present invention. Here, a description of the contents of the second embodiment the same as those of the first embodiment is omitted.

As shown in FIG. 4A, first sacrificial layers 50 and second sacrificial layers 51 are alternately formed on a substrate 60 having a given lower structure including a source region 61 formed thereon. In the second embodiment, each of the first sacrificial layers 50 may be formed of an oxide layer, whereas each of the second sacrificial layers 51 is formed of a nitride layer.

Subsequently, the first sacrificial layers 50 and the second sacrificial layers 51 are etched to form channel holes, and a first charge blocking layer 59, a floating gate material layer 54, a tunnel insulating layer 56, and a vertical channel layer 57 are formed in each of the channel holes. Here, each of the first charge blocking layers 59 may be formed of a high dielectric constant (high-k) material layer, such as a hafnium oxide layer HfO, or an ONO layer having an oxide layer, a nitride layer, and an oxide layer stacked one upon another.

As shown in FIG. 4B, the first sacrificial layers 50 and the second sacrificial layers 51 are etched to form slits S between the channel holes. Subsequently, the first sacrificial layers 50 exposed within the slits S are removed to form first recessed regions. Second charge blocking layers 55 and conductive layers 52 are formed in the first recessed regions. Here, only the conductive layers 52 may be formed in the first recessed regions without forming the second charge blocking layers 55 therein.

As shown in FIG. 4C, the second sacrificial layers 51 exposed within the slits S are removed to thereby form second recessed regions. Subsequently, the floating gate material layer 54 and the first charge blocking layer 59 exposed within the second recessed regions are etched. In this manner, first charge blocking layers 59A and floating gates 54A are formed. Insulating layers 58 are formed in the second recessed regions and the slits S.

According to the second embodiment as described above, each of the memory cells includes the first charge blocking layer 59A having an annular shape to cover the vertical channel layer 57 and the second charge blocking layer 55 having a U shape to cover the conductive layer 52, that is, the control gate. Accordingly, data retention characteristics of the memory device may be improved.

Figure 5A:
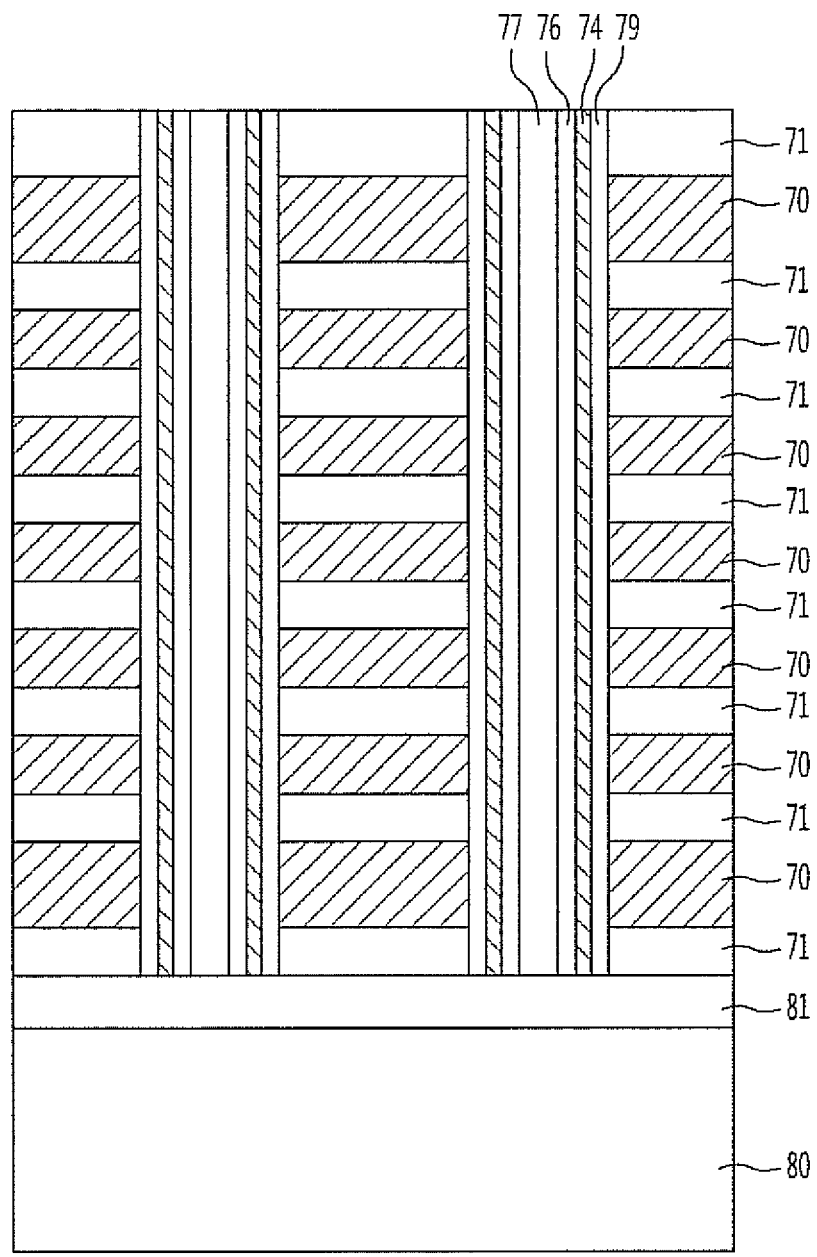
FIGS. 5A and 5B are cross-sectional views illustrating the process flow of a method of manufacturing a semiconductor device according to a third embodiment of the present invention.
Figure 5B:
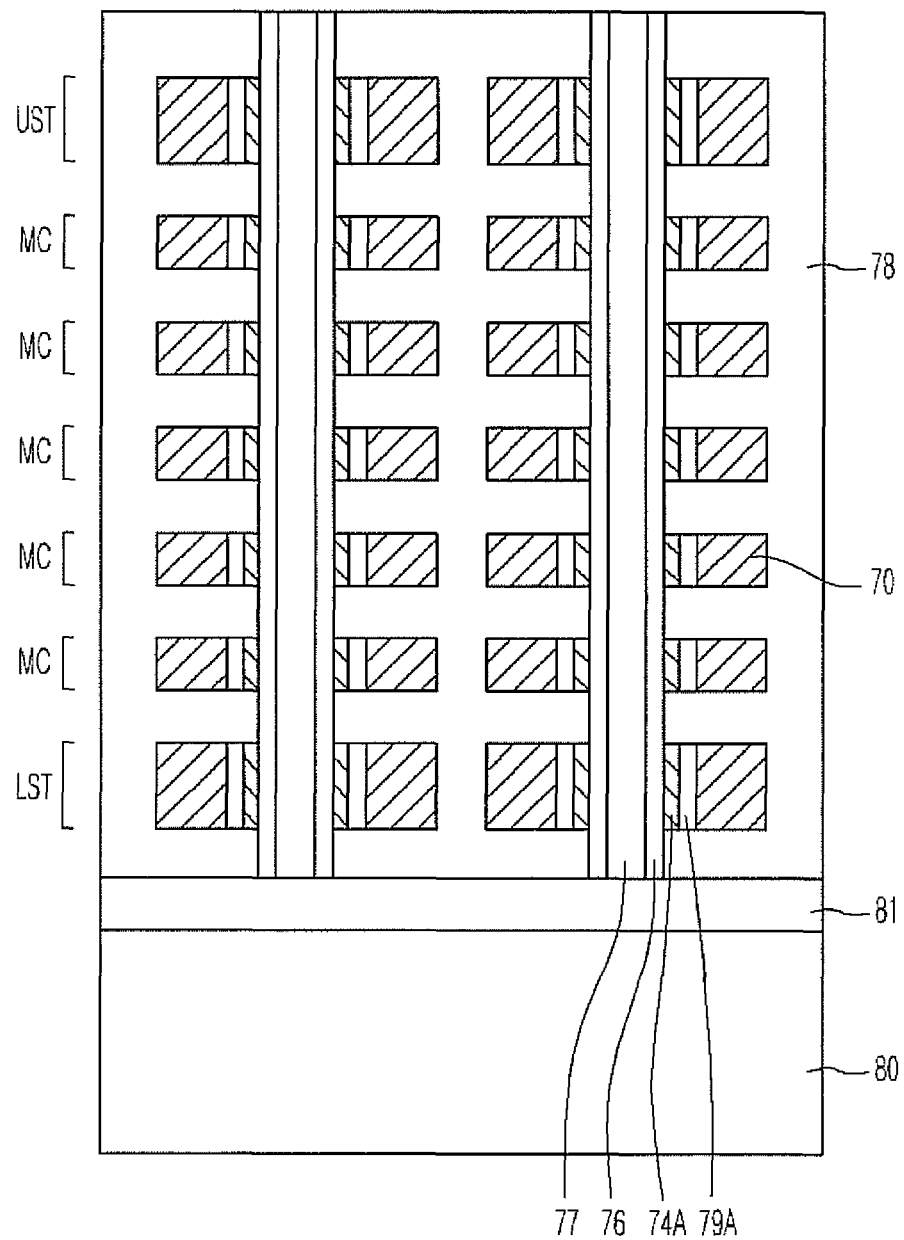

FIGS. 5A and 5B are cross-sectional views illustrating the process flow of a method of manufacturing a semiconductor device according to a third embodiment of the present invention. Here, a description of the contents of the third embodiment the same as those of the first and second embodiments is omitted.

As shown in FIG. 5A, conductive layers 70 and sacrificial layers 71 are alternately formed on a substrate 80 having a given lower structure including a resource region 81 formed thereon. Here, the conductive layers 70 may be formed of a polysilicon layer, a doped polysilicon layer, a doped amorphous silicon layer, and a metal layer, while the sacrificial layers 71 may be formed of an oxide layer, a nitride layer, an undoped polysilicon layer, and an undoped amorphous silicon layer. In the third embodiment, each of the conductive layers 70 may be formed of a tungsten layer, and each of the sacrificial layers 71 are formed of a nitride layer.

Subsequently, the conductive layers 70 and the sacrificial layers 71 are etched to form channel holes, and a charge blocking layer 79, a floating gate material layer 74, a tunnel insulating layer 76, and a vertical channel layer 77 are formed within the channel holes.

As shown in FIG. 5B, the conductive layers 70 and the sacrificial layers 71 are etched to form slits between the channel holes. Subsequently, the sacrificial layers 71 exposed within the slits are removed to form recessed regions. The floating gate material layer 74 and the charge blocking layer 79 exposed within the recessed regions are etched. In this manner, charge blocking layers 79A and floating gates 74A are formed. Insulating layers 78 are then formed in the recessed regions and the slits.

According to the third embodiment as described above, since a charge blocking layer is not formed in the recessed regions, the height of the stacked layers may be reduced. In addition, a process of forming a conductive layer after the sacrificial layers are removed is not performed, thereby reducing the number of processes. Accordingly, manufacturing cost may be reduced.

Figure 6:
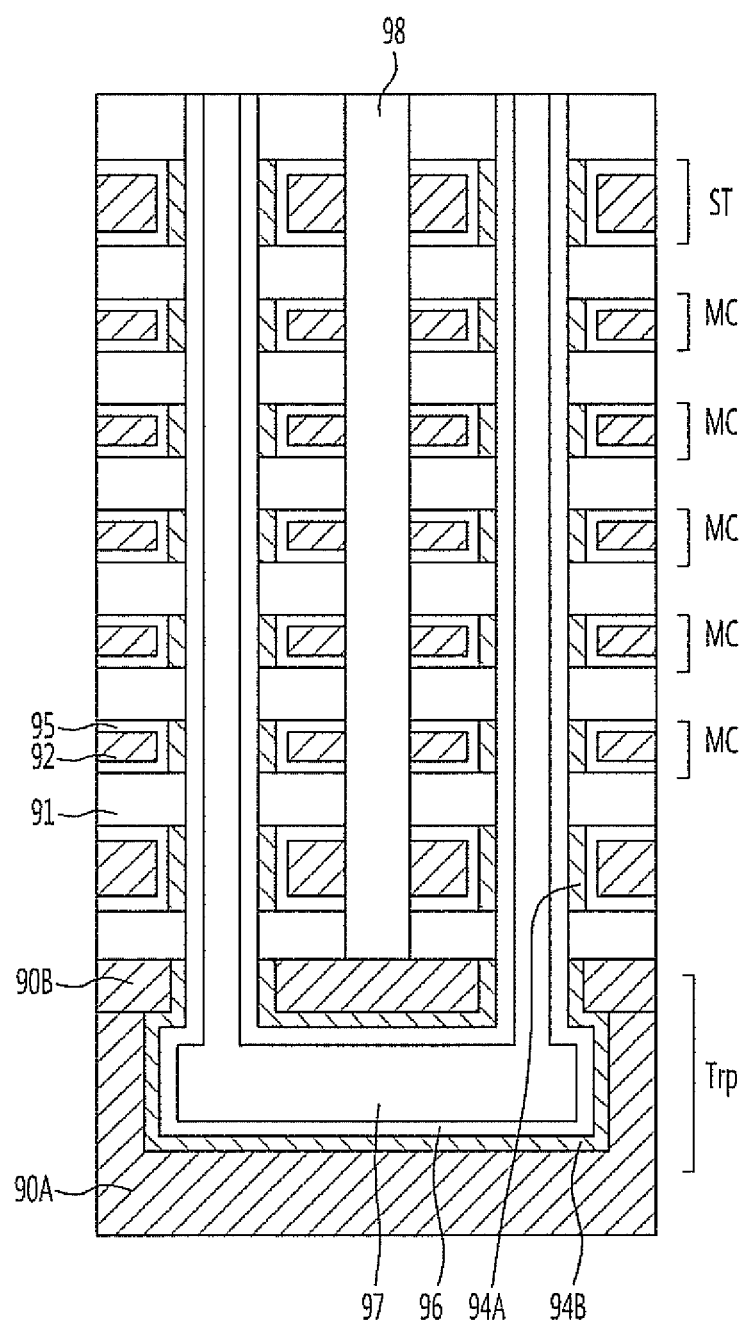
FIG. 6 is a cross-sectional view illustrating a semiconductor device according to a fourth embodiment of the present invention.

FIG. 6 is a cross-sectional view illustrating a semiconductor device according to a fourth embodiment of the present invention.

As shown in FIG. 6, a semiconductor device according to a fourth embodiment of the present invention includes pipe gates 90A and 90B, and interlayer insulating layers 91 and conductive layers 92 alternately stacked on the pipe gates 90A and 90B. At least the uppermost conductive layer 92 is used as a select gate, while the other conductive layers 92 are used as control gates. In addition, the semiconductor device further includes U-shaped channel layers 97. Each of the channel layers 97 includes a pipe channel layer, formed in the pipe gates 90A and 90B, and first and second vertical channel layers having lower ends coupled to each other through the pipe channel layer.

According to the above-described configuration, a plurality of memory cells MC are stacked one upon another along the first and second vertical channel layers, and select transistors ST are stacked on top of the memory cells. In addition, the memory cells MC stacked along the first vertical channel layer and the memory cells MC stacked along the second vertical channel layer are coupled to each other by a pipe transistor Trp to thereby form a single string.

Though not shown in the FIG. 6, the first vertical channel layer is coupled to a source line (not shown) formed on the upper part of the select gate, whereas the second vertical channel layer is coupled to a bit line (not shown) formed on the upper part of the select gate.

Each of the memory cells MC and each of the select transistors ST include a tunnel insulating layer 96 covering the first or second vertical channel layer, a floating gate 94A, a charge blocking layer 95, and a control gate 92. The tunnel insulating layer 96, the floating gate 94A, and the charge blocking layer 95 are used as a gate insulating layer. In addition, as described above, when the memory cell MC and the select transistor ST are formed by using separate processes, the select transistor ST may not include the floating gate 94A and include a gate insulating layer formed of an oxide layer.

The pipe transistor Trp includes the tunnel insulating layer 96 covering the pipe channel layer, a floating gate material layer 94B, and the pipe gates 90A and 90B. The second pipe gate 90B serves as an etch-stop layer during an etching process in which the slits S are formed, and it also functions to improve cell current by covering a top face of the pipe channel layer. In addition, since the floating gate material layer 94B contacts the pipe gates 90A and 90B, the floating gate material layer 94B serves as a pipe gate.

A method of manufacturing the semiconductor device according to the fourth embodiment will now be described in brief. The first pipe gate 90A is etched to form trenches, and first sacrificial layers including a silicon nitride layer and a titanium nitride layer are formed in the trenches. Subsequently, the second pipe gate 90B is formed on the first pipe gate 90A having the first sacrificial layers formed thereon, and second sacrificial layers and third sacrificial layers are alternately stacked thereon. The second sacrificial layers, the third sacrificial layers, and the second pipe gate 90B are etched to form channel holes being coupled to pipe trenches. After the first sacrificial layers in the trenches are removed, the floating gate material layer and the tunnel insulating layers 96 are formed along the inner surfaces of the channel holes and the trenches. A channel layer 97 is formed on the tunnel insulating layers 96. Processes of etching the second sacrificial layers and the third sacrificial layers to form the slits S and forming the charge blocking layer 95 and the conductive layer 92 are performed in the same manner as in the first embodiment.

For reference, the process of forming the second pipe gate 90B may be omitted. In addition, the first sacrificial layers may be removed after the floating gate material layer is formed in the inner walls of the channel holes. In this case, the pipe transistor Trp does not include the floating gate material layer 94B.

As set forth above, the semiconductor device according to the fourth embodiment is manufactured by using the method according to the first embodiment. However, the semiconductor device according to the fourth embodiment may also be manufactured by using the method according to the second or third embodiment.

Figure 7:
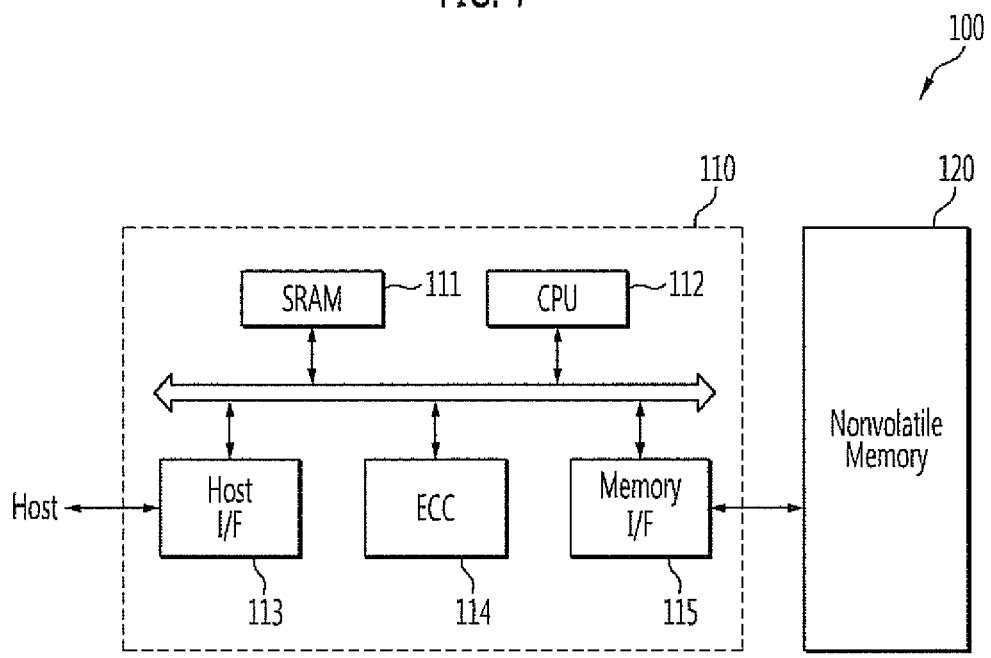
FIG. 7 is a view illustrating the configuration of a memory system according to an embodiment of the present invention.

FIG. 7 is a view illustrating the configuration of a memory system according to an embodiment of the present invention.

As shown in FIG. 7, a memory system 100 according to an embodiment of the present invention includes a non-volatile memory device 120 and a memory controller 110.

The non-volatile memory device 120 has the cell structure described according to the first to fourth embodiments. In addition, the non-volatile memory device 120 may be a multi-chip package composed of a plurality of flash memory chips.

The memory controller 110 is configured to control the non-volatile memory device 120. The memory controller 110 may include SRAM 111, a CPU 112, a host interface 113, an ECC 114, and a memory interface 115. The SRAM 111 is used as an operation memory of the CPU 112. The CPU 112 performs the general control operation for data exchange of the memory controller 110. The host interface 113 includes a data exchange protocol of a host being coupled to the memory system 100. In addition, the ECC 114 detects and corrects errors included in data read from the non-volatile memory device 120. The memory interface 115 performs to interface with the non-volatile memory device 120. The memory controller 110 may further include RCM that stores code data to interface with the host.

The memory system 100 having the above-described configuration may be a solid state disk (SSD) or a memory card in which the memory device 120 and the memory controller 110 are combined. For example, when the memory system 100 is an SSD, the memory controller 110 may communicate with the outside (e.g., a host) through one of the interface protocols including USB, MMC, PCI-E, SATA, PATA, SCSI, ESDI, and IDE.

Figure 8:
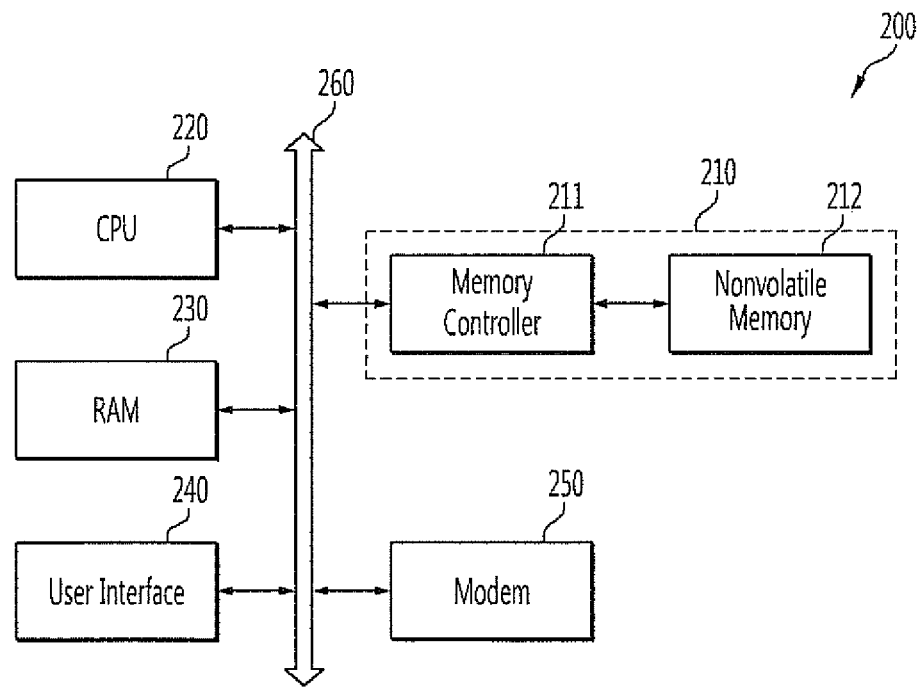
FIG. 8 is a view illustrating the configuration of a computing system according to an embodiment of the present invention.

FIG. 8 is a view illustrating the configuration of a computing system according to an embodiment of the present invention.

As shown in FIG. 8, a computing system 200 according to an embodiment of the present invention may include a CPU 220, RAM 230, a user interface 240, a modem 250, and a memory system 210 that are electrically coupled to a system bus 260. In addition, when the computing system 200 is a mobile device, a battery may be further included to apply operating voltage to the computing system 200. The computing system 200 may further include application chipsets, a Camera Image Processor (CIS), and mobile DRAM.

As described above with reference to FIG. 7, the memory system 210 may include a non-volatile memory 212 and a memory controller 211.

According to embodiments of the present invention, data retention characteristics of a semiconductor device may be improved, cell current may be increased, and a coupling ratio may be increased to thereby improve driving characteristics of the semiconductor device. In addition, the difficulty in the process of manufacturing a semiconductor device may be reduced.

What is claimed is:

1. A method of manufacturing a semiconductor device, the method comprising:
   forming first sacrificial layers and second sacrificial layers alternately with each other;
   forming channel holes by etching the first sacrificial layers and the second sacrificial layers;
   forming a floating gate material layer, a tunnel insulating layer, and a channel layer in the channel holes;
   forming slits by etching the first sacrificial layers and the second sacrificial layers;
   forming first recessed regions by removing the first sacrificial layers exposed in the slits;
   forming first charge blocking layers in the first recessed regions;
   forming conductive layers in the first recessed regions having the first charge blocking layers formed therein;
   forming second recessed regions by removing the second sacrificial layers exposed in the slits;
   forming floating gates by etching the floating gate material layer exposed through the second recessed regions; and
   forming interlayer insulating layers in the second recessed regions from which the floating gate material layer is etched.

2. The method of claim 1, further comprising:
   forming second charge blocking layers in the channel holes before the forming of the floating gate material layer; and
   etching the second charge blocking layers exposed through the second recessed regions after the forming of the first recessed regions.

3. The method of claim 1, wherein each of the first sacrificial layers is formed of an oxide layer, and each of the second sacrificial layers is formed of a nitride layer.

4. The method of claim 1, wherein each of the conductive layers includes a poly silicon layer or a tungsten layer.

5. The method of claim 1, wherein the floating gate material layer has a thickness of 10 nm or less.

6. The method of claim 1, further comprising:
   forming a pipe gate having trench filled with third sacrificial layers before the forming of the first and second sacrificial layers,
   wherein the first and second sacrificial layers are alternately formed on the pipe gate.

7. The method of claim 6, wherein the forming of the channel holes comprises:
    forming the channel holes to expose the third sacrificial layers; and
    removing the exposed third sacrificial layers.

8. The method of claim 7, wherein the forming of the floating gate material layer, the tunnel insulating layer, and the channel layer comprises forming the floating gate material layer, the tunnel insulating layer, and the channel layer in the pipe trenches.

9. A method of manufacturing a semiconductor device, the method comprising:
    forming conductive layers and sacrificial layers alternately with each other;
    forming channel holes by etching the conductive layers and the sacrificial layers;
    forming a charge blocking layer, a floating gate material layer, a tunnel insulating layer, and a channel layer in the channel holes;
    forming slits by etching the conductive layers and the sacrificial layers;
    forming recessed regions by removing the sacrificial layers exposed in the slits;
    etching the charge blocking layer exposed through the recessed regions and the floating gate material layer exposed through the etched charge blocking layer; and
    forming interlayer insulating layers in the recessed regions from which the charge blocking layer and the floating gate material layer are etched.

10. The method of claim 9, wherein each of the conductive layers is formed of a polysilicon layer or a tungsten layer, and each of the sacrificial layers is formed of an oxide layer or a nitride layer.

11. The method of claim 9, wherein the floating gate material layer has a thickness of 10 nm or less.

* * * * *